United States Patent [19]
Ohtsuki

[11] Patent Number: 4,531,225
[45] Date of Patent: Jul. 23, 1985

[54] CHARGE COUPLED DEVICE WITH MEANDER CHANNEL AND ELONGATED, STRAIGHT, PARALLEL GATE ELECTRODE

[75] Inventor: Osamu Ohtsuki, Kobe, Japan
[73] Assignee: Fujitju Limited, Kawasaki, Japan
[21] Appl. No.: 332,241
[22] Filed: Dec. 18, 1981

Related U.S. Application Data

[63] Continuation of Ser. No. 887,655, Mar. 17, 1978, abandoned, which is a continuation-in-part of Ser. No. 735,639, Oct. 26, 1976, abandoned.

[30] Foreign Application Priority Data

Oct. 31, 1975 [JP] Japan ................. 50-131941
Dec. 24, 1975 [JP] Japan ................. 50-153232
Dec. 29, 1975 [JP] Japan ................. 50-156876

[51] Int. Cl.³ ............... G11C 19/28; H01L 29/78; H03H 15/02
[52] U.S. Cl. .................. 377/58; 357/24; 333/165; 377/60
[58] Field of Search .......... 357/24; 377/57-63; 333/165

[56] References Cited

U.S. PATENT DOCUMENTS

| | | | |
|---|---|---|---|
| 3,745,383 | 7/1973 | Sangster | 357/24 |
| 3,789,240 | 1/1974 | Weimer | 357/24 |
| 3,789,267 | 1/1974 | Krambeck et al. | 357/24 |
| 3,858,232 | 12/1974 | Boyle et al. | 357/24 |
| 3,906,542 | 9/1975 | Krambeck et al. | 357/24 |
| 3,973,138 | 8/1976 | Puckette et al. | 357/24 |

OTHER PUBLICATIONS

Ohtsuki et al., "CCD with Meander Channel", *Japanese J. Applied Physics*, vol. 15, No. 6 (6/76), pp. 1173–1174.
Ohtsuki et al., "CCD with Meander Channel", 3rd. Int. Conf., Technol. and Applications of CCD'S, Edinburgh (9/76), pp. 38–43.
Sequin et al., *Charge Transfer Devices* Academic Press, N.Y. (7/75), pp. 18–31, 42–53, 58, 59, 144–146, 216–218, 226–228.
Sangster, "Integrated Bucket-Brigade Delay Line Using MOS Tetrodes", *Philips Technical Review*, vol. 31 (1970) p. 266.
Buss et al., "Transversal Filtering Using Charge Transfer Device", *IEEE J. Solid-State Circuits*, vol. Sc-8 (4/73), pp. 138–146.
Steen, "Digital Integrated Circuits with Mosts", *Philips Technical Review*, vol. 31 (1970), p. 283.
Sequin et al., *Charge Transfer Devices*, Academic Press, N.Y. (7/75) pp. 90–97.

*Primary Examiner*—Gene M. Munson
*Attorney, Agent, or Firm*—Daniel Jay Tick

[57] ABSTRACT

A charge coupled device has a meandering charge path formed by a channel stop of unique shape. The channel stop is of interdigitated pattern, and the gate electrodes form a straight strip. The channel stop pattern and an asymmetric depletion layer formed within the channel cause the transfer of the charge through the channel via the meandering charge path. A transversal filter and imaging device are readily provided by extracting the signal from one or both sides of the channel.

3 Claims, 15 Drawing Figures

FIG. 1
*PRIOR ART*

TWO DIMENSION CHARGE COUPLED DEVICE

FIG. 2
*PRIOR ART*

SINGLE LINE CHARGE COUPLED DEVICE

CHARGE COUPLED DEVICE WITH MEANDER CHANNEL AND ELONGATED, STRAIGHT, PARALLEL GATE ELECTRODE

BACKGROUND OF THE INVENTION

This is a continuation of application Ser. No. 887,655 filed Mar. 17, 1978 and now abandoned which in turn is a continuation-in-part of application Ser. No. 735,639, filed Oct. 26, 1976, for Charge Coupled Device, and now abandoned.

The present invention relates to a charge coupled device. More particularly, the invention relates to a semiconductor charge coupled device having a meandering charge path.

A charge coupled device is hereinafter referred to as a CCD.

The conventional charge coupled device usually has the same number of bus lines as the phases of transfer pulse trains and each gate electrode is respectively connected to any of such bus lines. Since the bus lines are usually formed on a semiconductor or substrate with insulating film used for separating them, electrostatic capacitance, that is MOS capacitance, exists between the bus lines and the substrate. When the size of the electrode becomes small, the capacitance of the bus lines becomes comparable with the sum of the capacitance of the electrodes. The load of the clock pulse generator used as the transfer pulse source thus becomes heavy.

Furthermore, in a CCD in which the gate electrodes are arranged on the substrate surface in the shape of a matrix consisting of rows and columns, electrodes forming a group arranged in a direction, for example, in the direction along the columns, are connected and always kept at the same potential. It is therefore impossible to permit each row to perform the transfer operation individually. Any attempt to individually drive each row of such a CCD results in very complicated wiring patterns, because of the need for a bus line to be arranged for each row, and results in low integration density. Moreover, when a line address is carried out by using the CCD as a memory device, individual transfer for each row is necessary. However, the foregoing facts are disadvantageous for a line address.

The principal object of the invention is to provide a charge coupled device which overcomes the disadvantages of known types of similar devices.

An object of the invention is to provide a charge coupled device of simple electrode structure.

Another object of the invention is to provide a charge coupled device which is simple and inexpensive in manufacture.

Still another object of the invention is to provide a charge coupled device which is readily converted to a transversal filter or imaging device.

Since the CCD of the invention has gate electrodes in the shape of straight strips, the manufacturing process may be simplified and each line may be easily individually driven when many lines are arranged in parallel. Furthermore, since the signal may easily be extracted from a side or both sides of the charge path, due to the meandering charges transfer route, the CCD of the invention may be readily utilized as a transversal filter or line image sensor or imaging device.

BRIEF SUMMARY OF THE INVENTION

The present invention is a CCD having a meandering charge path and devices using such a CCD. The CCD of the invention has an interdigital channel stop or stops formed on the semiconductor substrate surface. The meandering charge path may be established by the channel stop or stops. The cells of each CCD are staggered. Typically, the gate electrodes are formed in the shape of two straight strips. On the other hand, a means for forming an asymmetrical depletion layer such as, for example, a non-uniform thickness of the insulating film is added to each cell. When two pulse trains having different phases relative to each other are applied to the two strip electrodes, the signal charge is transferred to the longitudinal direction of the charge path over the meandering route.

In accordance with the invention, a charge coupled device comprises a semiconductor substrate of predetermined conductivity type. The substrate has a surface. A channel stop is formed on the substrate surface and has a pair of substantially band-shaped portions extending in spaced substantially parallel relation. The channel stop comprises a high impurity concentration layer of the predetermined conductivity type formed on the substrate surface. A charge transfer area is bounded by the band-shaped portions. A plurality of short channel stop portions extend from each of the band-shaped portions toward the center of the charge transfer area. Each of the short channel stop portions terminates at a predetermined space from the band-shaped portion toward which it extends. The short channel stop portions are spaced from each other along the length of the device and thereby form a meander-shaped charge transfer route in the charge transfer area. Less than three substantially strip-shaped linearly extending gate electrodes extend substantially parallel with the band-shaped portions of the channel stop in the charge transfer area.

The channel stop and short channel stop portions form an interdigitated pattern.

The short channel stop portions typically extend substantially perpendicularly from each of the band-shaped portions in spaced substantially parallel relation with each other. The short channel stop portions extending from each of the band-shaped portions are substantially equidistant from each other along the length of the device. The short channel stop portions extending from each of the band-shaped portions are substantially equidistant from the short channel stop portions extending from the other of the band-shaped portions.

Insulating means is interposed between the substrate and the gate electrodes for insulating the gate electrodes from the substrate.

An asymmetrical depletion layer or layers is or are formed in the charge transfer area between next-adjacent short channel stop portions. The charge transfer area has sides. At least one projecting portion extends from the channel stop at a side of the charge transfer area. Signal input and output means are provided in the projecting portion or portions. A regenerative amplifier amplifies an extracted signal charge and returns the amplified signal charge to the projecting portion.

Next-adjacent gate electrodes forming a pair are spaced from each other by a gap. A film of electrically insulative material covers the gate electrodes and fills the gap between the gate electrodes. A conductive layer is provided on the film of insulative material over the gap.

Next-adjacent gate electrodes forming a pair are spaced from each other by a gap. The substrate is of predetermined conductivity type. A region of opposite conductivity type from the predetermined conductivity type is provided on the substrate surface, just below the gap.

Next-adjacent gate electrodes forming a pair are spaced from each other by a gap. A semiconductor layer of high resistivity fills the gap and contacts both electrodes.

A film of electrically insulative material covers the substrate. The asymmetrical depletion layer is formed by a partial difference in the thickness of the film of insulative material covering the charge transfer area.

A photosensitive portion or portions is or are provided at the center of the charge transfer area. The meander-shaped charge transfer route is provided on both sides of the photosensitive portion and the meander-shaped charge transfer route on both sides of the photosensitive portion transfers the charge generated in the photosensitive portion.

In accordance with the invention, a transversal filter comprises a semiconductor substrate having a surface. A channel stop is formed on the substrate surface and has band-shaped portions extending in spaced substantially parallel relation to each other. Each of the band-shaped portions has a plurality of spaced projecting portions connected thereto and extending therefrom toward the other to form a meander shape. A meander-shaped charge transfer area is bounded by the band-shaped portions. The charge transfer area forming a charge transfer route has a pair of spaced opposite ends and sides including the projecting portions of the charge transfer area. Each of a plurality of signal extracting means is in a corresponding projecting portion of the charge transfer area. Each of the signal extracting means extracts a signal from the corresponding projecting portion of the charge transfer area. A plurality of weighting circuits provide a weighting coefficient to extracted signals. Each of the weighting circuits is connected to a corresponding one of the signal extracting means. A signal input is provided at one end of the charge transfer area. A signal output is provided at the opposite end of the charge transfer area. A filtered signal output is connected to the weighting circuits. A plurality of short channel stop portions extend from each of the band-shaped portions toward the center of the charge transfer area. Each of the short channel stop portions terminates at a predetermined space from the band-shaped portion toward which it extends. The short channel stop portions are spaced from each other along the length of the substrate and thereby form a meander-shaped charge transfer route in the charge transfer area. A summing circuit is interposed and interconnected between the weighting circuit and the filtered signal output.

BRIEF DESCRIPTION OF THE DRAWINGS

In order that the invention may be readily carried into effect, it will now be described with reference to the accompanying drawings, wherein.

DETAILED DESCRIPTION OF THE INVENTION

Figure 1:
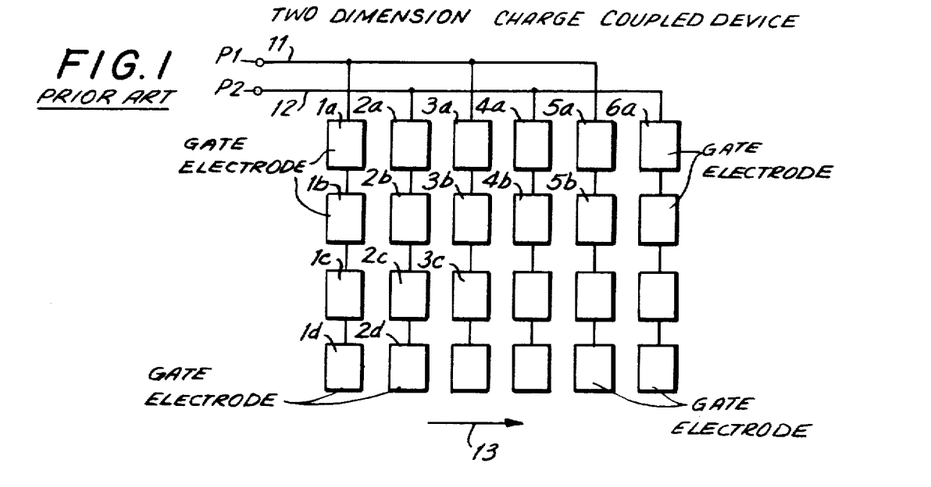
FIG. 1 is a circuit diagram of the electrode arrangement of a two-dimensional type charge coupled device of the prior art.

FIG. 1 illustrates a two-dimensional driving type CCD of the prior art having matrix electrodes. The CCD of FIG. 1 has gate electrodes 1a, 1b, 1c, 1d, 2a, 2b, 2c, 2d, 3a, 3b, 3c, 3d, 4a, 4b, 4c, 4d, 5a, 5b, 5c, 5d, 6a, 6b, 6c and 6d. The gate electrodes form a matrix consisting of rows and columns. The electrodes of each column are connected to each other and all the electrodes in each column are kept at the same potential. The columns of the gate electrodes 1a to 1d, the gate electrodes 3a to 3d and the gate electrodes 5a to 5d are connected to a bus line 11. The columns of the gate electrodes 2a to 2d, the gate electrodes 4a to 4d and the gate electrodes 6a to 6d are connected to the bus line 12.

When pulse trains having different phases are applied respectively to input terminals P1 and P2 connected to the bus lines 11 and 12, respectively, charge transfer is carried out. In this case, charge transfer is always performed in the direction shown by the arrow 13, that is, the direction in each row, and is not performed in the direction in each column. Furthermore, since half the gate electrodes are connected to each bus line, just half the total capacitance generated between each electrode and the substrate is loaded on the clock pulse generator which generates the pulse trains to be applied to the bus lines. It is a disadvantage that all the gate electrodes of the other rows are loaded on the clock pulse generator, even if the transfer is necessary only at one row. Attempts to avoid this disadvantage result in at least one bus line for each row. As a result, the wiring pattern becomes complicated and the integration density is also degraded.

Figure 2:
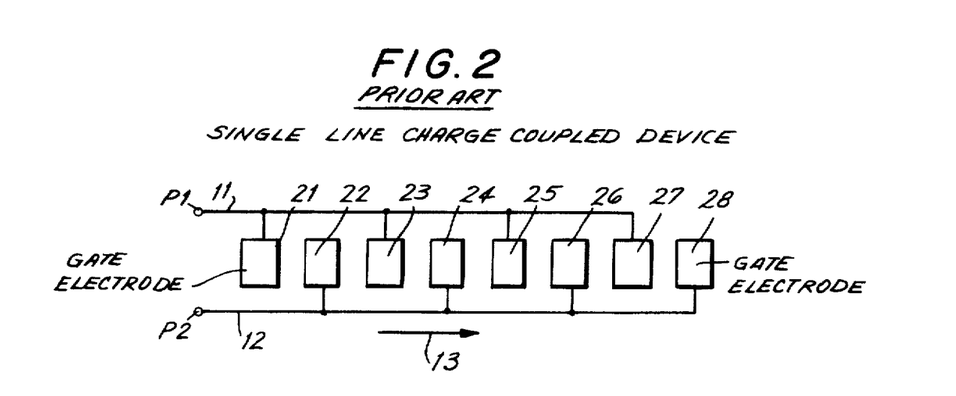
FIG. 2 is a circuit diagram of the electrode arrangement of a single line, two-dimensional type charge coupled device of the prior art.

As is obvious from FIG. 2, a CCD of single line type also requires two bus lines 11 and 12 in addition to gate electrodes 21, 22, 23, 24, 25, 26, 27 and 28 for transfer. The capacitance of the bus line is not negligible compared with the capacitance of the gate electrodes, as hereinbefore described.

Figure 3:
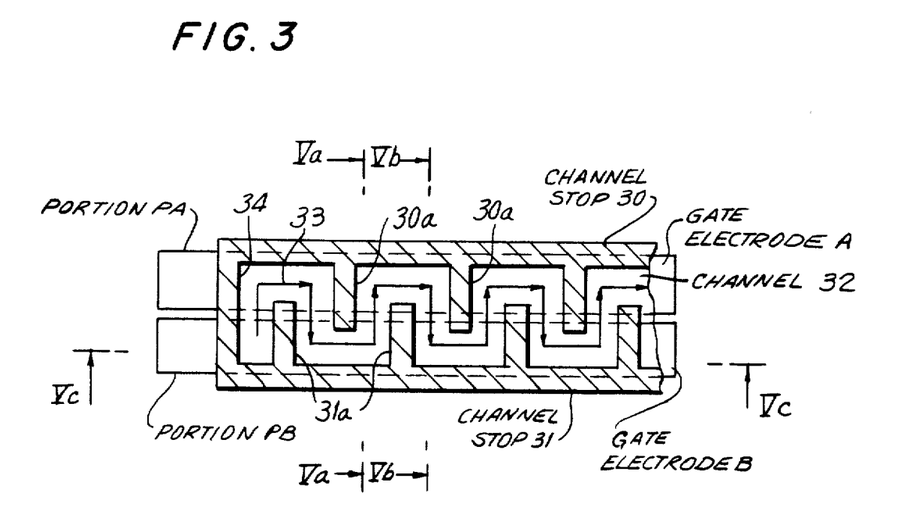
FIG. 3 is a schematic diagram of an embodiment of the charge coupled device of the invention, showing the channel stop pattern.

FIG. 3 is a plan view of an embodiment of the CCD of the invention. In FIG. 3, the semiconductor substrate surface area 32 between parallel extending channel stops 30 and 31 in the shape of bands corresponds to the area in which the charge transfers, that is, the channel. The channel stops 30 and 31 have no simple band shape, but short portions 30a and 31a projecting toward the center of the channel 32. The short portions are interdigitated. The provision of such a pattern for the channel stops, results in a meandering charge transfer path, indicated by a line 33 with arrow heads thereon. The charge transfer mechanism is hereinafter described.

The broken line in FIG. 3 indicates the shape and position of gate electrodes A and B which are strip-shaped and extend linearly. Portions PA and PB of the gate electrodes are terminals for connection. Although it is not shown in FIG. 3, the gate electrodes A and B are separated from the substrate by an insulating film, such as, for example, silicon dioxide film, $SiO_2$. The $SiO_2$ film is non-uniform in thickness, and is hereinafter described. In the embodiment of FIG. 3, the parallel portions 30 and 31 of the channel stop are coupled as shown by 34 at the left end. The coupling is provided in order to partition the left end of the channel 32. There is no need for such a coupling when the left part is the end of the substrate.

Figure 4:
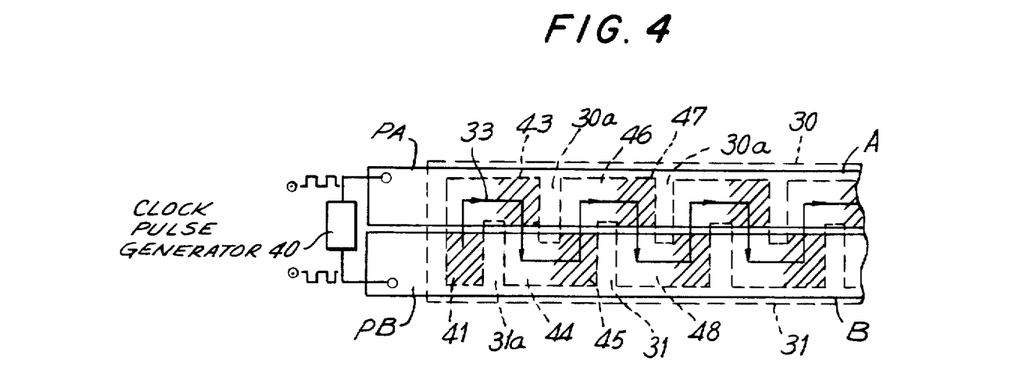
FIG. 4 is a schematic diagram of the embodiment of FIG. 3, showing the gate electrode pattern and charge transfer route.

The charge transfer mechanism of the embodiment of FIG. 3 is explained with reference to FIG. 4. In FIG. 4, the gate electrodes A and B are shown by solid lines and the edges of the channel stop are shown by broken lines. In FIG. 4, a two phase clock pulse generator 40 is connected to the terminals PA and PB. The clock pulse generator 40 generates two square pulse trains, having a phase difference of a half period or $\pi$ radian between them, as the clock pulse for transfer.

As hereinbefore described, the thickness of the $SiO_2$ film under the gate electrodes is non-uniform in the embodiment of FIGS. 3 and 4. For a more accurate presentation, the portion of the insulating film which is thinner than the remainder thereof is shaded in FIG. 4. Furthermore, the conductivity type of the substrate is assumed to be p type for convenience. The polarity of the clock pulse is therefore assumed to be positive. In order to distinguish different parts of the channel 32 from each other, each of the small areas sandwiched by two short channel stops which are adjacently arranged under the same gate electrodes is hereinafter referred to as a cell. The right half and the left half of each cell is hereinafter referred to as a half cell. The half cells are numbered 41, 42, 43, 44, 45, 46, 47, 48 . . . .

It is assumed that the potential of the terminal PA is zero, which is the same potential as the substrate, the potential of the terminal PB is positive, and the charge to be transferred is stored in the depletion layer generated under the lower left half cell 41. If the potential of the terminal is reversed, and the terminal PA becomes positive, and the potential of the terminal PB is zero, the charge stored under the half cell 41 is once transferred to the half cell 42. However, since the depletion layer formed at the area below the half cell 43 is deeper than that under the half cell 41, the charge immediately flows into the depletion layer under the half cell 43 and is stored there. Then, when the potential of the terminals is again reversed, and the potential of the terminal PA becomes zero and the potential of the terminal PB becomes positive, the charge passes the half cell 44 and is transferred to the area under the half cell 45.

The partial difference in the depth of the depletion layer, as hereinbefore mentioned, is based on the unevenness of the thickness of the $SiO_2$ film. In other words, since the depletion layer formed under the thin $SiO_2$ film is deeper than that under the thick $SiO_2$ film, the charge which has been transferred to the half cell under the thick $SiO_2$ film is naturally moved to the inside of the deeper depletion layer even if the gate voltage is constant. However, there is no possibility of a backward flow of the charge from the half cell 44 to the half cell 41. This is due to the separation of the half cells from each other by short channel stops 31a. As described, the charge to be transferred is advanced toward the right following the route, indicated by the line 33 having the arrow heads, through the channel 32.

The embodiment of FIGS. 3 and 4 performs substantially the same function as the conventional CCD. The CCD of the invention may thus be used for the same applications as the conventional CCD, that is, as shift registers and imaging devices. Furthermore, the embodiment of FIGS 3 and 4 has no bus line corresponding to the bus lines 11 and 12 of the conventional CCD, and the electrodes A and B are simple straight strips. For this reason, the electrostatic capacitance loaded on the clock pulse generator 40 is considerably less compared to that of the conventional CCD.

Figure 5A:
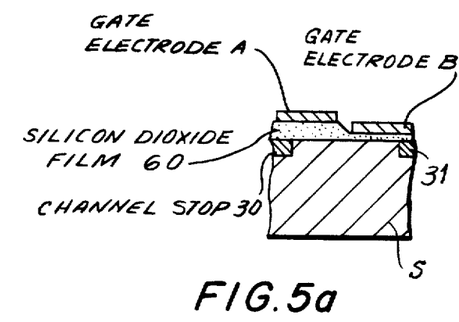
FIG. 5a is a cross-sectional view, taken along the lines Va—Va, of FIG. 3.
Figure 5B:
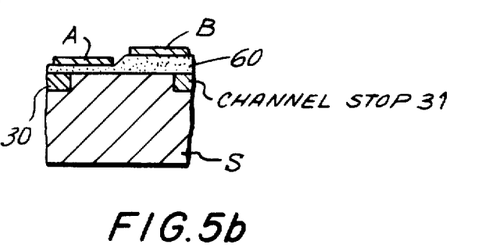
FIG. 5b is a cross-sectional view, taken along the lines Vb—Vb, of FIG. 3.
Figure 5C:
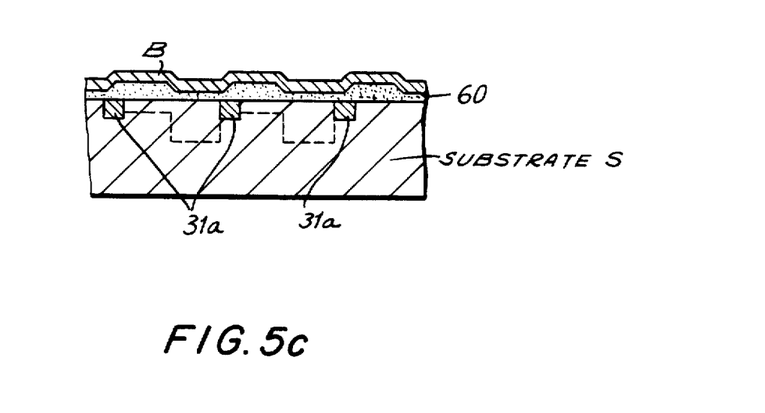
FIG. 5c is a cross-sectional view, taken along the lines Vc—Vc of FIG. 3.

FIGS. 5a, 5b and 5c are sectional views of three different embodiments of the CCD of the invention, as hereinbefore described. FIG. 5a is a sectional view, taken along the lines Va—Va, of FIG. 3, FIG. 5b is a sectional view, taken along the lines Vb—Vb, of FIG. 3. FIG. 5c is a sectional view, taken along the lines Vc—Vc, of FIG. 3. The broken line inside the semiconductor substrate S in FIG. 5c shows the forming of the depletion layer caused in the substrate when a transfer voltage is applied to the gate electrode B, for example, and the depletion layer formed at the portion under the thin $SiO_2$ film 60 is deeper than the remainder of the film, as shown in FIG. 5c.

Figure 6:
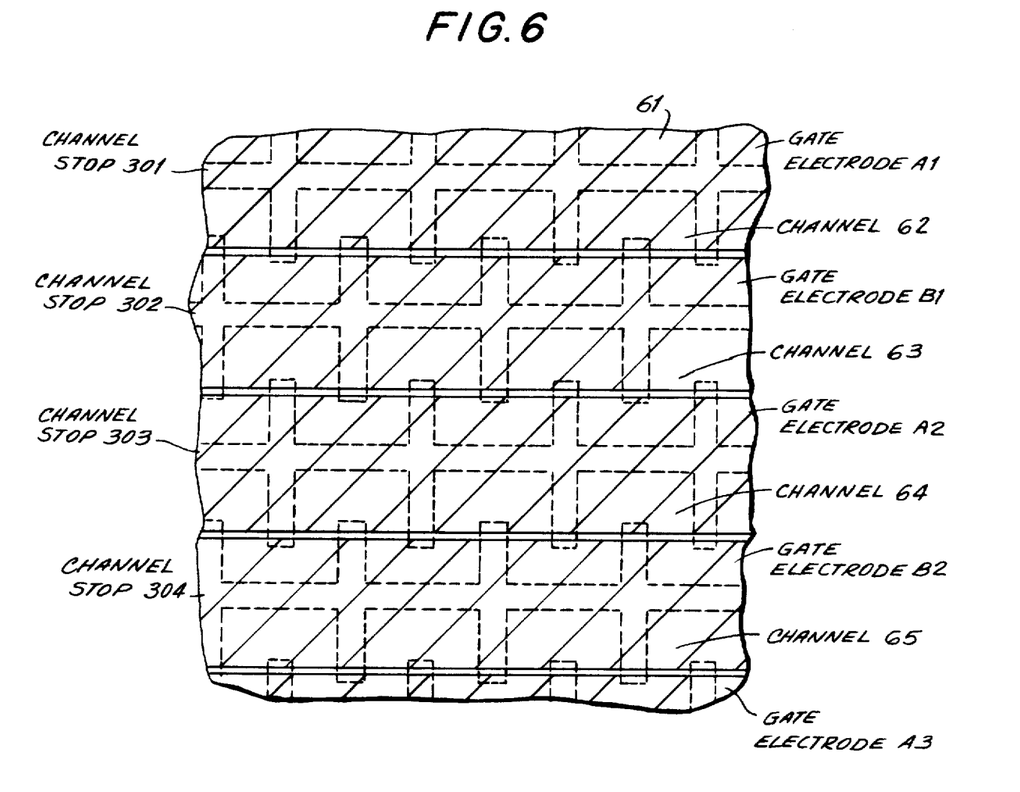
FIG. 6 is a schematic top plan view of an embodiment of the two-dimensional type charge coupled device of the invention.

FIG. 6 shows an embodiment of the two-dimensioned type charge coupled device of the invention. In FIG. 6, the CCD has channel stops 301, 302, 303, 304, . . . , gate electrodes A1, A2, A3, . . . and B1, B2, B3, . . . , and channels 61, 62, 63, 64, 65, . . . . As is readily evident from FIG. 6, each electrode may easily be electrically independent. Furthermore, electrodes of the necessary number may also be connected in parallel very easily.

Therefore, the electrodes A1, A2, A3, . . . and B1, B2, B3, . . . , for example, are connected in parallel, respectively, and these electrodes may be divided into two groups. Additionally, the voltage may be applied only to the selected electrode, without complicated multilayered wirings. These advantages are very useful for line addresses.

The charge coupled device of the invention may be modified for various applications in addition to the embodiments hereinbefore described. Such modifications are hereinafter described.

In the embodiments of FIGS. 3 and 6, the charge transfer route is extended in a meandering direction, and such charge transfer direction may be changed half way, as required, at any angle. Thus may be done by bending the channel stops 30 and 31 in FIG. 3 at the desired angle and simultaneously bending the gate electrodes A and B at the same angle as the channel stops.

In FIG. 3, the channel stops 30 and 30a extend at right angles to each other. However, the angle formed by the channel stops may be changed freely. Furthermore, although the short channel stops 30a extend from the longer channel stop 30 in FIG. 3, a gap, if it is narrow, may be formed between each channel stop 30a and the channel stop 30. Gaps may also be provided between each channel stop 31a and the channel stop 31.

A semiconductor, such as silicon or gallium arsenide, may be used as the gate electrode and a conductive metal oxide, such as tin oxide, may be used in addition to a metal, such as aluminum, chromium, silver, or the like. Furthermore, as a countermeasure for the potential barrier which is often caused under a gap between a pair of next-adjacent gate electrodes, it is recommended that the gap be filled with a high resistivity material, or that a third electrode be formed on the gap, but insulated from the gate electrode.

Figure 7A:
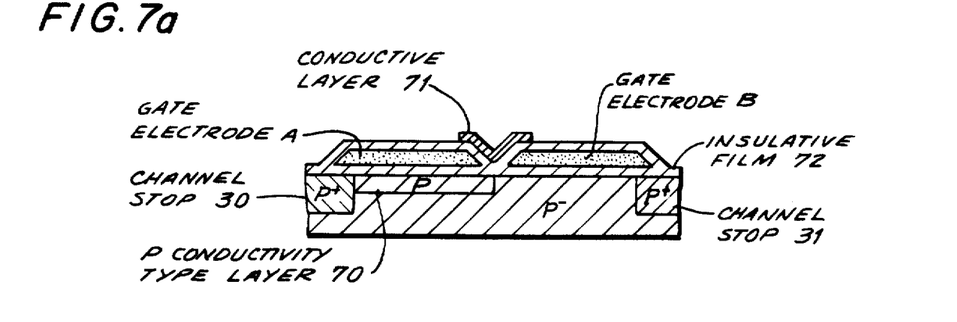
FIGS. 7a, 7b and 7c are cross-sectional views of three different embodiments of the charge coupled device of the invention.
Figure 7B:
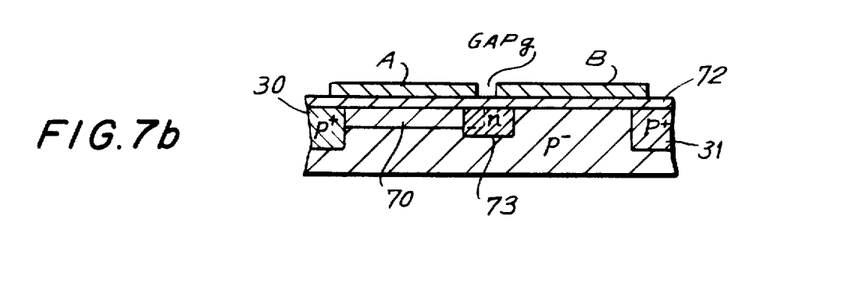
Figure 7C:
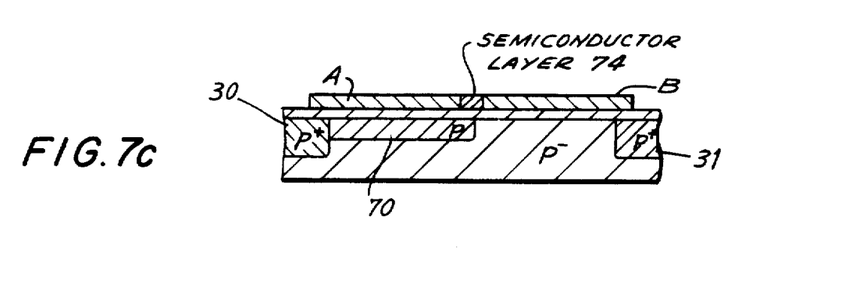

FIGS. 7a, 7b and 7c illustrate three ways for preventing the formation of the potential barrier. In FIGS. 7a, 7b and 7c, the CCD has gate electrodes A and B and channel stops 30 and 31. In FIGS. 7a, 7b and 7c, p, n, p+, p− are the conductivity type and resistivity of each semiconductor. The symbol p+ indicates a p conductivity type having a low resistivity or high impurity concentration, while the symbol p− indicates a p conductivity type having a high resistivity or low impurity concentration.

In FIG. 7a, a conductive layer 71 is formed between the gate electrodes A and B. The conductive layer 71 is separated from both gate electrodes by an insulative or insulating film 72.

In FIG. 7b, an n conductivity type layer 73 is formed under a gap g between the gate electrodes A and B. In FIG. 7c, the gap g is filled by a semiconductor layer 74 of high resistivity.

In FIGS. 7a, 7b and 7c, the p conductivity type layer 70, which has a little higher impurity concentration than the substrate, is provided in the channel. The p conductivity type layer 70 is provided for guiding the charge, and this makes it unnecessary to provide a partial difference of thickness to the SiO₂ film.

The CCD of the invention makes it easy to extract the signal which is transferred as the charge from the side of the channel and to provide some processing, based on the unique charge transfer mechanism, of the shape and arrangement of the gate electrodes. In this case, a complicated crossover technique is not required.

Figure 8:
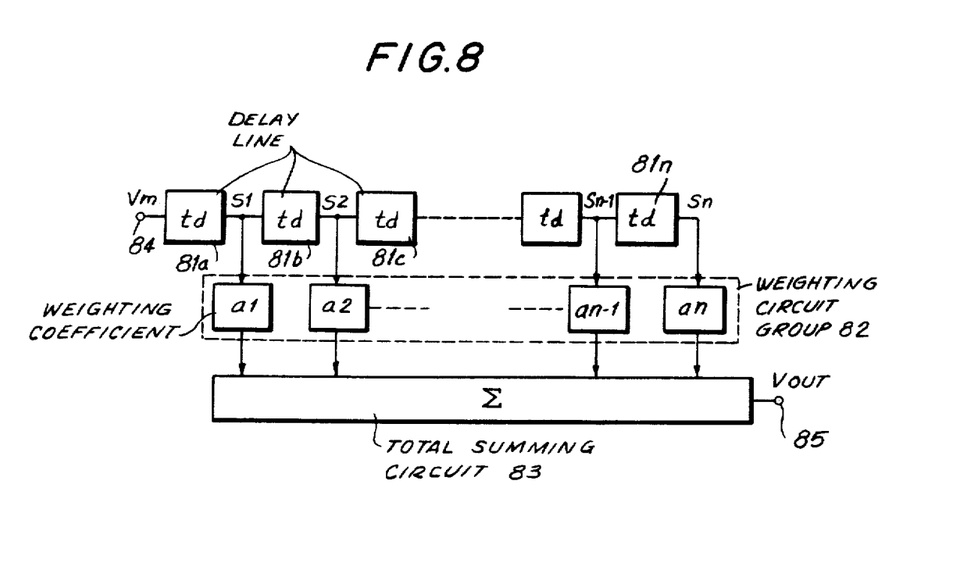
FIG. 8 is a block diagram explaining the principle of operation of the transversal filter of the invention.

FIG. 8 is a block diagram for explaining the principle of operation of the transversal filter. In FIG. 8, a total of n delay lines 81a, 81c to 81n are connected in series and the taps are extracted from the joints of each delay line. The signal to be filtered is applied to an input terminal 84. Weighting coefficients a1, a2, a3 to an are respectively multiplied to the voltages S1, S2, S3 and Sn appearing at each tap via a weighting circuit group 82. The outputs of the weighting circuit group 82 are connected to a total summing circuit 83. The output voltage Vout appears at the output terminal 85.

The output voltage is defined as $$Vout = S1a1 + S2a2 + S3a3 + \ldots + Snan = \sum_{i=1}^{n} Siai$$

Therefore, when the delay time of one stage is assumed to be td, $$Vout\,(i\,td) = \Sigma ak\,Sk$$
$$= \Sigma hk\,Vin\,[(i - k)td]$$

wherein Vin is the input voltage.

The Fourier transform of the right term becomes $$F\left\{\sum_{k=1}^{n} hk\,Vin\,[(i - k)td]\right\} = \sum_{h=-\infty}^{\infty} \sum_{k=1}^{n} Vin\,[(i - k)td]\,\epsilon^{-j\omega m td}$$

$$= \sum_{k=1}^{m} hk\,\epsilon^{-j\omega m td} \sum_{m=-\infty}^{\infty} Vm\,(mtd)\,\epsilon^{-j\omega m td}$$

$$\approx H(\omega)\,F\,[Vin\,(t)]$$

The transfer function of the circuit, that is, the transfer function between the input terminal and the output terminal for the signal after processing is therefore almost equal to H(ω). That is, the circuit of FIG. 8 has substantially the same function as a filter having a frequency characteristic of H(ω). The transversal filter of the invention utilizes the CCD as the aforedescribed delay lines.

Figure 9:
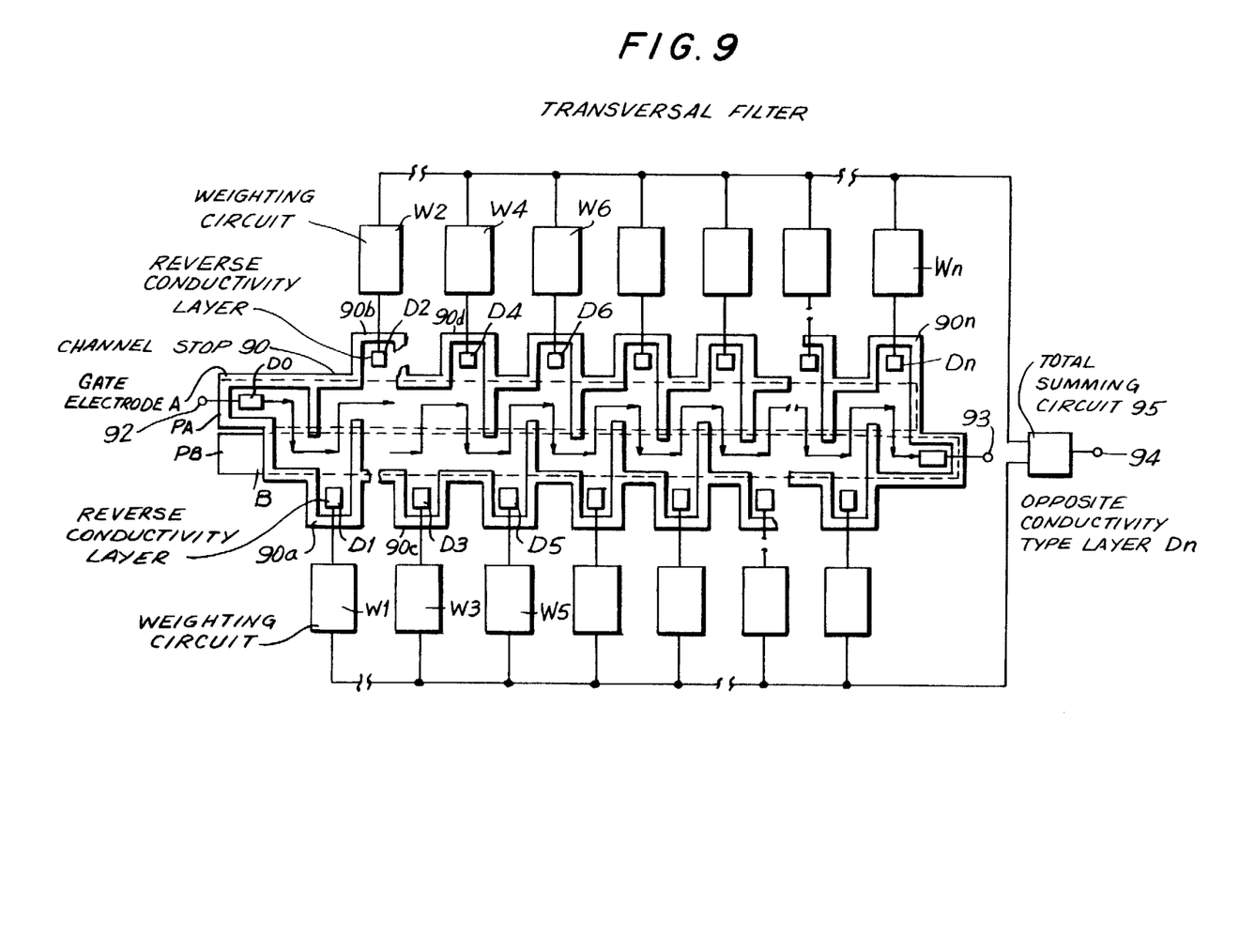
FIG. 9 is a plan view of an embodiment of the transversal filter of the invention.

FIG. 9 shows the major part of an embodiment of the transversal filter of the invention. In the embodiment of FIG. 9, projecting portions 90a, 90b, 90c, 90d to 90n are provided at the channel stop 90, and reverse conductivity layers D1, D2, D3 to Dn are formed in each projecting portion. The signal is extracted from each of the projecting portions 90a to 90n. Weighting is provided by weighting circuits W1, W2, W3 to Wn. An input terminal 92 provides the signal to be filtered. An output terminal 93 provides the signal which has passed the CCD and a filter output terminals 94 provides the filtered signal. The output signal at the filter output terminal has the desired frequency spectrum and said signal is applied to an external circuit, if required.

Opposite conductivity type layers Do and Dn are provided for the input and output, respectively, of the signal. A total summing circuit 95 is provided. The line with the arrow heads thereon indicates the route via which the charge is transferred. The gate electrodes A and B are similar to those of FIG. 3. Although the projecting portions 90a to 90n are provided for each stage in the embodiment of FIG. 9, they may be provided for each desired stage.

As is obvious from FIG. 9, any projecting portion is not covered by the gate electrodes A and B. Therefore, it is obvious that the wiring for applying the signal extracted from the reverse conductivity layers D1, D2, D3, to Dn and supplied to the weighting circuits W1, W2, W3, to Wn, does not cross either of the gate electrodes. The crossover technique is thus not required.

The CCD of the invention, with a meandering channel may easily branch the signal to the side of the channel, as hereinbefore mentioned. For this reason, when a transfer to a plurality of stages is required, signal loss due to transfer may be compensated by amplifying the signal extracted to the side of the channel and then returning it to the channel again.

Figure 10:
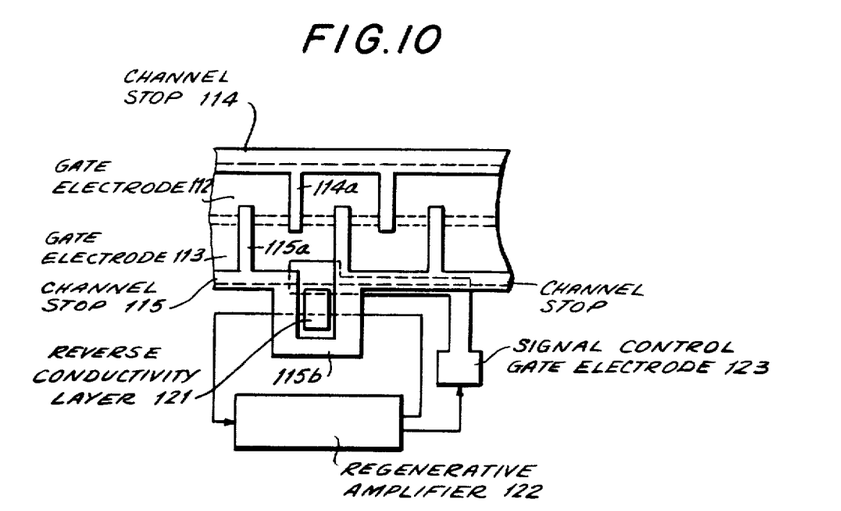
FIG. 10 is a schematic diagram of an embodiment of the imaging device of the invention including a regenerative amplifier.

FIG. 10 shows a portion of the arrangement of the invention for signal extraction and regeneration by amplification. In FIG. 10, interdigitated channel stops 114 and 115 have projecting portions 114a and 115a. In addition, a projecting portion 115b is provided at the side of the channel stop 115 and a reverse conductivity layer 121, for signal input and output, is formed inside the portion 115b. The extracted signal charge is amplified by a regenerative amplifier 122 and the amplified signal charge is returned to the reverse conductivity type layer 121. Thereafter, as described with reference to FIG. 4, the signal is transferred along the meandering route by means of the clock pulse applied to the gate electrodes 112 and 113.

A signal control gate electrode 123 controls the signal input and output and is called the signal control gate electrode to distinguish it from the gate electrodes 112 and 113 for charge transfer. In FIG. 10, the signal control gate electrode 123 opens when the regeneration amplifier 122 receives the input signal. However, the signal control gate electrode 123 may also be controlled by the transfer clock pulse.

Figure 11:
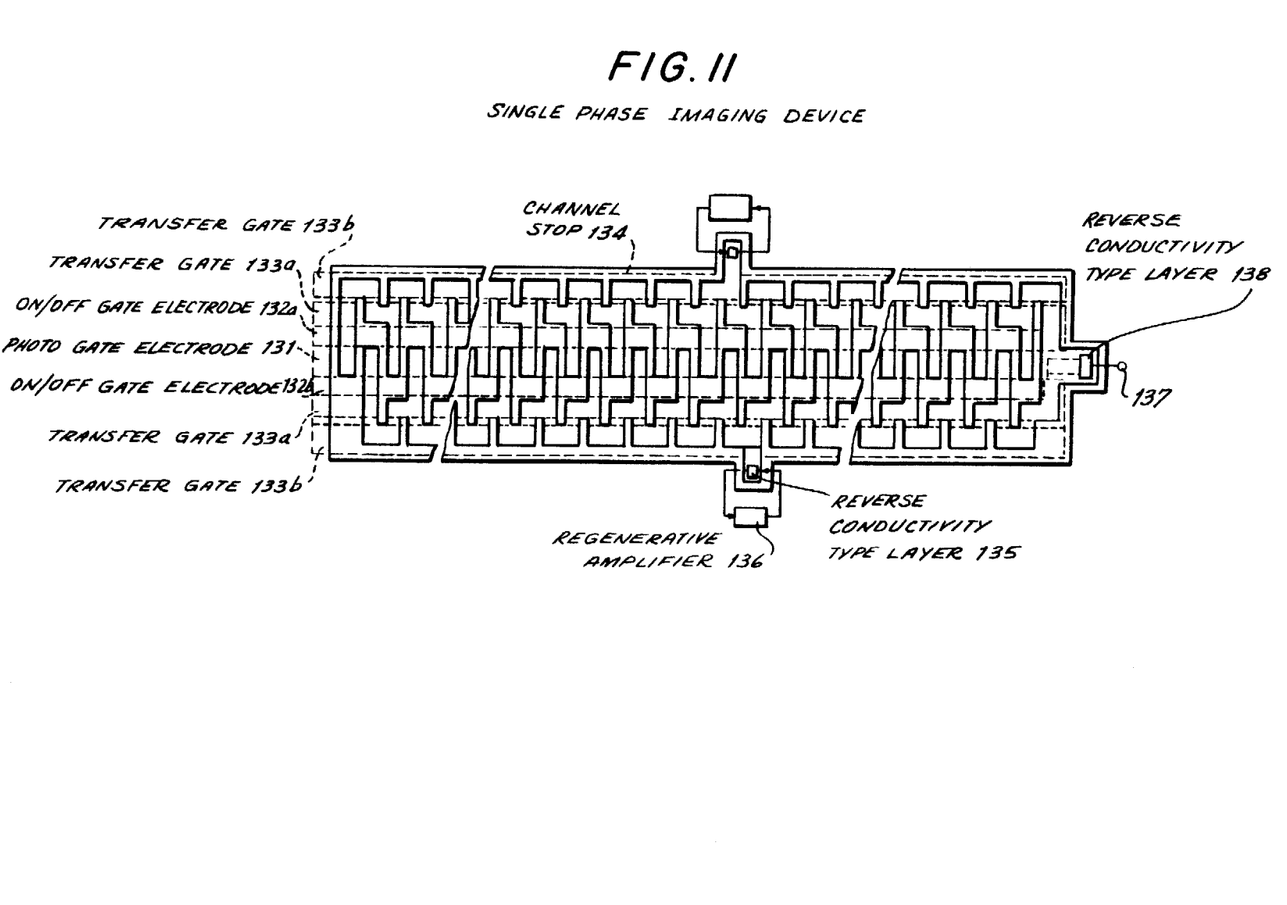
FIG. 11 is a plan view of the overall embodiment of FIG. 10.

FIG. 11 is a single line imaging device of the invention. In FIG. 11, the substrate area covered with a photo gate electrode 131 is a photosensitive area, except for the channel stop 134. The photosensitive area provides the photoelectric conversion function. When the photosensitive area is irradiated by light, the generated charge, that is, the mobile carrier, is controlled by ON/OFF gate electrodes 132a, 132b. When a voltage is applied to each ON/OFF gate electrode 132a and 132b, the generated charge enters the charge transfer portion and is transferred by transfer gates 133a and 133b. Thereafter, the charge may be extracted from the output terminal 137 at the right hand side.

The charge generated by the incident light shifts the charge transfer area under the electrodes 132a and 132b on both sides, respectively, via the transfer gates 133a and 133b. Furthermore, the charge is transferred along the meandering route by the voltage applied to the gate electrodes 132a and 132b. The channel stop of FIG. 11 corresponds to the channel stops 30 and 31 of FIG. 3.

The imaging device of FIG. 11 has reverse conductivity type layers 135 and 138 for signal extraction and a regenerative amplifier 136. As is clear from FIG. 11, the imaging device of the invention does not require a bus line for applying a clock pulse, and therefore, the substrate area occupied is small, so that the device is designed very compactly as a whole.

As may be understood from the foregoing explanation, the CCD of the invention may greatly simplify the shape of the transfer (gate) electrodes on the basis of the shape of the unique channel stop pattern and charge transfer mechanism. As a result, almost every bus line for feeding the clock pulse to the gate electrode may be eliminated. This not only results in high integration density, but also simplifies the manufacturing process. Furthermore, signals are easily extracted from and injected into the channel side without a crossover technique. The transversal filter of the invention may thus provide wiring for the weighting circuit without crossover. On the other hand, the imaging device of the invention does not require the establishment of a bus line outside the channel and may be of compact configuration for the entire device including the regenerative amplifier.

While the invention has been described by means of specific examples and in specific embodiments, I do not wish to be limited thereto, for obvious modifications will occur to those skilled in the art without departing from the spirit and scope of the invention.

I claim:

1. A transversal filter, comprising a semiconductor substrate of predetermined conductivity type, said substrate having a surface;

a pair of substantially band-shaped channel stops formed on the substrate surface and extending in spaced substantially parallel relation, said channel stops comprising a high impurity concentration layer of the predetermined conductivity type formed on said substrate surface, each of said band-shaped channel stops having a plurality of spaced outwardly projecting portions extending therefrom away from the projecting portions of the other;

a charge transfer area bounded by the band-shaped channel stops;

a plurality of short channel stops comprising a plurality of spaced inwardly projecting portions extending from each of said band-shaped channel stops, said short channel stops alternately extending from each of the band-shaped channel stops toward the center of the charge transfer area, each of the short channel stops terminating at a predetermined space from the opposing band-shaped channel stop, the short channel stops comprising the high impurity concentration layer of the predetermined conductivity type formed on said substrate surface in an interdigitated pattern with the channel stops;

a plurality of cells each comprising a small area between next-adjacent short channel stops of a corresponding one of the band-shaped channel stops, said cells being staggered along said charge coupled device;

means for forming an asymmetrical depletion layer in each of said cells in a regular arrangement to determine a transfer direction of the charge;

a film of electrically insulative material covering the charge transfer area;

a pair of elongated parallel gate electrodes over said insulative film, one of said gate electrodes commonly covering the cells of one of the band-shaped channel stops and the other of said gate electrodes commonly covering the cells of the other of the band-shaped channel stops thereby forming a single directional meander-shaped charge transfer channel in the charge transfer area under said pair of gate electrodes, the charge transfer area forming a charge transfer route having a pair of spaced opposite ends and sides including said outwardly projecting portions;

a plurality of signal extracting means each in a corresponding outwardly projecting portion of the band-shaped channel stops, each of the signal extracting means extracting a signal from the corresponding outwardly projecting portion;

a plurality of weighting circuits for providing a weighting coefficient to extracted signals, each of the weighting circuits being connected to a corresponding one of the signal extracting means;

signal input means at one end of the charge transfer area;

signal output means at the opposite end of the charge transfer area;

filtered signal output means connected to the weighting circuits; and a summing circuit interposed and interconnected between the weighting circuit and the filtered signal output means.

2. A charge coupled device, comprising a semiconductor substrate of predetermined conductivity type, said substrate having a surface;

a pair of substantially band-shaped channel stops formed on the substrate surface and extending in spaced substantially parallel relation, said channel stops comprising a high impurity concentration layer of the predetermined conductivity type formed on said substrate surface;

a charge transfer area bounded by the band-shaped channel stops, said charge transfer area having sides;

a plurality of short channel stops alternately extending from each of the band-shaped channel stops toward the center of the charge transfer area, each of the short channel stops terminating at a predetermined space from the opposing band-shaped channel stop, the short channel stops comprising the high impurity concentration layer of the predetermined conductivity type formed on said substrate surface in an interdigitated pattern with the channel stops;

a plurality of cells each comprising a small area between next-adjacent short channel stops of a corresponding one of the band-shaped channel stops, said cells being staggered along said charge coupled device;

means for forming an asymmetrical depletion layer in each of said cells in a regular arrangement to determine a transfer direction of the charge;

a film of electrically insulative material covering the charge transfer area;

a pair of elongated parallel gate electrodes over said insulative film, one of said gate electrodes commonly covering the cells of one of the band-shaped channel stops and the other of said gate electrodes commonly covering the cells of the other of the band-shaped channel stops thereby forming a single directional meander-shaped charge transfer channel in the charge transfer area under said pair of gate electrodes;

at least one projecting portion extending from the channel stops at a side of the charge transfer area;

signal input and output means in the projecting portion or portions; and regenerative amplifier means for amplifying an extracted signal charge and returning the amplified signal charge to the projecting portion.

3. A charge coupled device having a semiconductor substrate of predetermined conductivity type, said substrate having a surface, a pair of substantially band-shaped channel stops formed on the substrate surface and extending in spaced substantially parallel relation, said channel stops comprising a high impurity concentration layer of the predetermined conductivity type formed on said substrate surface, a charge transfer area bounded by the band-shaped channel stops and having sides, at least one projecting portion extending from the channel stops at a side of the charge transfer area, a plurality of short channel stops alternately extending from each of the band-shaped channel stops toward the center of the charge transfer area, each of the short channel stops terminating at a predetermined space from the opposite band-shaped channel stop, the short channel stops comprising the high impurity concentration layer of the predetermined conductivity type formed on said substrate surface in an interdigitated pattern with the channel stops, said short channel stops extending substantially perpendicularly from each of the band-shaped channel stops in spaced substantially parallel relation with each other and the short channel stops extending from each of the band-shaped channel stops being substantially equidistant from each other along the length of the device, with the short channel stops extending from each of the band-shaped channel stops being substantially equidistant from the short channel stops extending from the other of the band-shaped channel stops, a plurality of cells each comprising a small area between next-adjacent short channel stops of a corresponding one of the band-shaped channel stops, said cells being staggered along said charge coupled device, means for forming an asymmetrical depletion layer in each of said cells in a regular arrangement to determine a transfer direction of the charge, a film of electrically insulative material covering the charge transfer area, said charge coupled device comprising a pair of elongated parallel gate electrodes over said insulative film, one of said gate electrodes commonly covering the cells of one of the band-shaped channel stops and the other of said gate electrodes commonly covering the cells of the other of the band-shaped channel stops thereby forming a single directional meander-shaped charge transfer channel in the charge transfer area under said pair of gate electrodes, signal input and output means in the projecting portion, and regenerative amplifier means for amplifying an extracted signal charge and returning the amplified signal charge to the projecting portion.

* * * * *